(12) United States Patent
Shu et al.

(10) Patent No.: US 9,735,195 B2
(45) Date of Patent: Aug. 15, 2017

(54) ARRAY SUBSTRATE AND METHOD FOR MANUFACTURING THE SAME, X-RAY FLAT PANEL DETECTOR, IMAGE PICKUP SYSTEM

(71) Applicant: BOE TECHNOLOGY GROUP CO., LTD., Beijing (CN)

(72) Inventors: Shi Shu, Beijing (CN); Jincheng Gao, Beijing (CN); Chuanxiang Xu, Beijing (CN); Feng Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/913,174

(22) PCT Filed: Jul. 21, 2015

(86) PCT No.: PCT/CN2015/084549
§ 371 (c)(1),
(2) Date: Feb. 19, 2016

(87) PCT Pub. No.: WO2016/138725
PCT Pub. Date: Sep. 9, 2016

(65) Prior Publication Data
US 2016/0380022 A1    Dec. 29, 2016

(30) Foreign Application Priority Data
Mar. 3, 2015  (CN) .......................... 2015 1 0095303

(51) Int. Cl.
*H01L 27/146*  (2006.01)
*H01L 27/144*  (2006.01)
(Continued)

(52) U.S. Cl.
CPC .... *H01L 27/14685* (2013.01); *H01L 27/1443* (2013.01); *H01L 27/1446* (2013.01);
(Continued)

(58) Field of Classification Search
CPC ............. H01L 27/1443; H01L 27/1446; H01L 27/14629; H01L 27/14636;
(Continued)

(56) References Cited

U.S. PATENT DOCUMENTS 8,115,177 B2 * 2/2012 Takeda ................ A61B 6/4233
                                                           250/370.11
8,513,611 B2   8/2013 Okada
(Continued)

FOREIGN PATENT DOCUMENTS

CN    102313896 A    1/2012
CN    103839949 A    6/2014
(Continued)

OTHER PUBLICATIONS

International Search Report of PCT/CN2015/084549 in Chinese, dated Nov. 26, 2015 with English translation.
(Continued)

*Primary Examiner* — Mark R Gaworecki
(74) *Attorney, Agent, or Firm* — Collard & Roe, P.C.

(57) ABSTRACT

An array substrate and manufacturing method thereof, an X-ray flat panel detector and an image pickup system are provided. The array substrate is divided into a plurality of detection units, and each of the detection units has a first electrode and a photoelectric conversion structure provided therein. The first electrode is disposed on a side of the photoelectric conversion structure opposite to a light incident side, and is electrically connected to the photoelectric conversion structure. A reflective layer that is electrically conductive is further included between the first electrode and the photoelectric conversion structure, and a surface of the reflective layer facing the photoelectric conversion structure is a reflection surface. The utilization rate of light can be enhanced by the array substrate as stated in embodiments of the invention, so that the detection accuracy of the X-ray flat panel detector is enhanced.

20 Claims, 2 Drawing Sheets

(51) Int. Cl.
　　　H01L 31/02　　　　(2006.01)
　　　H01L 31/0224　　 (2006.01)
　　　H01L 31/0232　　 (2014.01)
　　　H01L 31/115　　　(2006.01)
(52) U.S. Cl.
　　　CPC .... *H01L 27/1462* (2013.01); *H01L 27/14612* (2013.01); *H01L 27/14629* (2013.01); *H01L 27/14636* (2013.01); *H01L 27/14658* (2013.01); *H01L 31/02327* (2013.01); *H01L 31/022408* (2013.01); *H01L 31/115* (2013.01)
(58) Field of Classification Search
　　　CPC ....... H01L 27/145658; H01L 27/14685; H01L 31/022408; H01L 31/02327; H01L 31/115
　　　See application file for complete search history.

(56)　　　　　　　References Cited

U.S. PATENT DOCUMENTS

| | | | |
|---|---|---|---|
| 9,269,740 | B2 | 2/2016 | Kim et al. |
| 9,490,282 | B2 * | 11/2016 | Yang ................ H01L 27/14629 |
| 9,543,331 | B2 | 1/2017 | Zhang et al. |
| 2009/0165850 | A1 * | 7/2009 | Saita ..................... C04B 35/453 |
| | | | 136/256 |
| 2010/0085299 | A1 * | 4/2010 | Yoon ....................... G02F 1/167 |
| | | | 345/107 |
| 2010/0282297 | A1 | 11/2010 | Sekimoto et al. |
| 2016/0380022 | A1 | 12/2016 | Shu et al. |

FOREIGN PATENT DOCUMENTS

| | | |
|---|---|---|
| CN | 103985717 A | 8/2014 |
| CN | 104637970 A | 5/2015 |
| JP | 2007-140016 A | 6/2007 |

OTHER PUBLICATIONS

Notice of Transmittal of the International Search Report of PCT/CN2015/084549 in Chinese, dated Nov. 26, 2015.
Written Opinion of the International Searching Authority of PCT/CN2015/084549 in Chinese, dated Nov. 26, 2015.
Chinese Office Action in Chinese Application No. 201510095303.0, dated Jan. 26, 2017 with English translation.
Second Chinese Office Action in Chinese Application No. 201510095303.0, dated Jun. 27, 2017 with English translation.

* cited by examiner

ARRAY SUBSTRATE AND METHOD FOR MANUFACTURING THE SAME, X-RAY FLAT PANEL DETECTOR, IMAGE PICKUP SYSTEM

CROSS REFERENCE TO RELATED APPLICATIONS

This application is the National Stage of PCT/CN2015/084549 filed on Jul. 21, 2015, which claims priority under 35 U.S.C. §119 of Chinese Application No. 201510095303.0 filed on Mar. 3, 2015, the disclosure of which is incorporated by reference.

TECHNICAL FIELD

Embodiments of the present invention relate to an array substrate and a method for manufacturing the same, an X-ray flat panel detector including the array substrate, and an image pickup system including the X-ray flat panel detector.

BACKGROUND

The flat panel detection technology has made rapid development in recent years, and can be classified into two types: direct type and indirect type, and the key component of an indirect flat panel detector is a flat panel detector (FPD) for acquiring images. An X-ray flat panel detector includes an array substrate including an X-ray transforming layer, and a thin film transistor and an amorphous silicon photodiode are included in each detection unit of the array substrate. The amorphous silicon photodiode starts to operate under the action of a reversed voltage. When the array substrate is irradiated by an X-ray, the X-ray is converted into a visible light beam by the X-ray transforming layer, then the visible light beam is converted into an electrical signal by the amorphous silicon photodiode, and it is stored. Under the action of a driving circuit, thin film transistors are switched on row by row, charges converted by photodiodes are transmitted to a data processing circuit, and further processes such as amplification, analog/digital conversion, and so on will be carried out by the data processing circuit, so as to ultimately obtain the image information.

An amorphous silicon thin film in an amorphous silicon photodiode suffers from a light-induced degradation effect, and this leads to degradation in the photoelectric conversion efficiency of the photodiode after it is irradiated by light for long time. In order to reduce the occurrence of light-induced degradation phenomenon, thickness of the amorphous silicon thin film can be reduced. But when thickness of the amorphous silicon thin film is reduced, incident lights cannot be fully absorbed, and the following case will occur: a great amount of light is transmitted by a photodiode element, and the conversion efficiency of the photodiode is reduced.

SUMMARY

According to an embodiment of the present invention, there is provided an array substrate, which is divided into a plurality of detection units, each of the detection units has a first electrode and a photoelectric conversion structure provided therein, wherein, the first electrode is disposed on a side of the photoelectric conversion structure opposite to a light incident side of the photoelectric conversion structure, and is electrically connected to the photoelectric conversion structure, wherein, a reflective layer that is electrically conductive is further included between the first electrode and the photoelectric conversion structure, and a surface of the reflective layer facing the photoelectric conversion structure is a reflection surface.

In some examples, the reflective layer is a conductive film layer electrically connected to the first electrode.

In some examples, the reflective layer and the first electrode are formed into an integral structure.

In some examples, the first electrode has a material including an oxide of a conductive metal, and the reflective layer is formed of an elementary substance of the metal.

In some examples, the reflective layer is formed of an elementary substrate of the metal that is obtained by carrying out a reduction reaction on a surface of the first electrode facing the photoelectric conversion structure.

In some examples, the metal oxide is indium tin oxide, and the reflective layer is formed of an elementary substance tin that is obtained by carrying out reduction reaction of the indium tin oxide.

In some examples, one thin film transistor is further included in each of the detection units, an insulating layer is provided between the thin film transistor and the first electrode, a via hole is disposed in the insulating layer at a location corresponding to a source electrode of the thin film transistor, and the first electrode is connected to the source electrode of the thin film transistor through the via hole.

In some examples, the photoelectric conversion structure includes a photodiode and a second electrode, a cathode layer of the photodiode is connected to the first electrode, and an anode layer of the photodiode is connected to the second electrode.

According to another embodiment of the present invention, there is provided a manufacturing method of an array substrate, comprising:

dividing the array substrate into a plurality of detection units;

forming a pattern including a first electrode within each of the detection units;

forming a pattern of a conductive reflecting layer on the pattern including the first electrode; and forming a photoelectric conversion structure on the pattern of the conductive reflecting layer, wherein, a surface of the reflective layer facing the photoelectric conversion structure is a reflection surface.

In some examples, the step of forming pattern of the conductive reflecting layer includes:

forming a conductive film layer on the first electrode.

In some examples, the reflective layer and the first electrode are formed into an integral structure.

In some examples, the first electrode has a material including a conductive metal oxide, and the step of forming the conductive reflecting layer includes:

introducing a reductive gas into a reactive chamber, so that a part of metal elementary substance in the metal oxide precipitate.

In some examples, the metal oxide is indium tin oxide.

In some examples, the reductive gas is hydrogen gas.

In some examples, a gas flux of the hydrogen gas is in a range of 20 to 500 sccm, the introducing time is in a range of 10 to 200 s, and a gas pressure of the reactive chamber is in a range of 100 to 300 mT, and an electrode power of the reactive chamber used for formation of plasma is in a range of 400 to 800 W.

In some examples, before the step of forming the pattern including the first electrode within each of the detection units, it further includes forming a thin film transistor within each of the detection units;

forming an insulating layer on the thin film transistor; and forming a via hole in the insulating layer at a location corresponding to a source electrode of the thin film transistor, so that the first electrode is connected to the source electrode of the thin film transistor.

In some examples, the step of forming the photoelectric conversion structure includes:

forming a photodiode, a cathode layer of which is connected to the first electrode; and forming a pattern including a transparent second electrode on an anode layer of the photodiode.

According to another embodiment of the present invention, there is provided an X-ray flat panel detector, which includes the array substrate as stated by any of the above items and an X-ray conversion layer disposed on the photoelectric conversion structure of the array substrate.

According to still another embodiment of the present invention, there is provided an image pickup system, which includes the aforesaid X-ray flat panel detector and a display device.

In some examples, the image pickup system further includes a control device, which is configured to transform an electric signal detected by the X-ray flat panel detector into an image signal, and to make the display device display an image in correspondence with the image signal.

BRIEF DESCRIPTION OF THE DRAWINGS

In order to illustrate the technical solution of the embodiments of the invention more clearly, the drawings of the embodiments will be briefly introduced below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Figure 1:
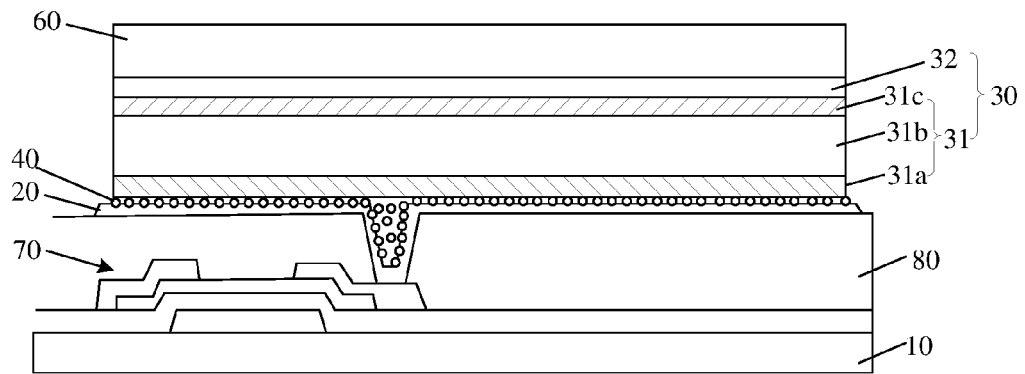
FIG. 1 is a structurally schematic view illustrating an X flat panel detector according to an embodiment of the invention.

According to at least an embodiment of the present invention, there is provided an array substrate, which is divided into a plurality of detection units. As illustrated in FIG. 1, within each of the detection units, there are provided a first electrode 20 and a photoelectric conversion structure 30 electrically connected to the first electrode 20, wherein, a reflective layer 40 that is electrically conductible is further included between the first electrode 20 and the photoelectric conversion structure 30, and a surface of the reflective layer 40 facing the photoelectric conversion structure 30 is a reflection surface. For example, as illustrated in FIG. 1, light beams are incident into the photoelectric conversion structure 30 from the upper side of the photoelectric conversion structure 30, and an upper side of the photoelectric conversion structure 30 can be called as a light incident side. So, the first electrode 20 and the reflective layer are each disposed on a side of the photoelectric conversion structure 30 opposite to the light incident side.

In at least an embodiment of the present invention, a photoelectric conversion structure 30 acts to transform incident light into electric signals, and to transmit them to a first electrode 20. In view of the fact that a reflective layer 40 is included between the first electrode 20 and the photoelectric conversion structure 30 of the array substrate, after a part of the incident light beams are transformed into electric signals by the photoelectric conversion structure 30, other incident light beams that have not been transformed into electric signals will go through the photoelectric conversion structure 30 once more after they are reflected by the reflective layer 40, so that the photoelectric conversion structure 30 executes a photoelectric conversion once more. Thus, the utilization rate of light is enhanced.

The photoelectric conversion structure 30 may include a photodiode 31. For example, as illustrated in FIG. 1, the photodiode 31 includes an N-type amorphous silicon film layer 31a, an intrinsic amorphous silicon film layer 31b disposed on the N-type amorphous silicon film layer 31a, and a P-type amorphous silicon film layer 31c disposed on the intrinsic amorphous silicon film layer 31b. Hole-electron pairs are produced by the photodiode 31 under the irradiation of visible light, electrons move toward the N-type amorphous silicon film layer, and holes move toward the P-type amorphous silicon film layer.

Embodiments of the invention do not set a specific limit to the connection form between the reflective layer 40 and the first electrode 20. In at least an embodiment of the invention, the reflective layer 40 may be a conductive film layer connected to a first electrode 20, and the reflective layer 40 may also be a light reflecting film layer formed between a first electrode 20 and a photoelectric conversion structure 30, such as a metal light reflecting film layer. For example, a film layer that is opaque may be formed on an upper surface of the first electrode by means of vapor deposition, and visible light beams that have not been converted by the photoelectric conversion structure 30 may be reflected back to the photoelectric conversion structure 30 by the conductive film layer.

In at least an embodiment of the invention, the reflective layer 40 and the first electrode 20 are formed into an integral structure.

For example, material for producing the first electrode 20 may include a metal oxide that is conductible, and the reflective layer 40 is formed of a metal elementary substance layer that is obtained by carrying out a reduction reaction for a surface of the first electrode 20 facing the photoelectric conversion structure 30. Thus, introduction of other material to function as a reflective layer is avoided, and the manufacturing process is simplified.

For example, the metal oxide may be indium tin oxide, and the reflective layer 40 is formed of an elementary substance tin that is obtained by carrying out a reduction reaction of the indium tin oxide. Precipitation of an elementary substance tin decreases the transmittance of the first electrode that is originally transparent, and it is formed to be the reflective layer on a surface of the first electrode, so that it can diffuse incident light beams.

Further, as illustrated in FIG. 1, a thin film transistor 70 is further included within each of detection units of the array substrate. The thin film transistor 70 is disposed on a base, and an insulating layer 80 is provided between the thin film transistor 70 and the first electrode. A via hole is disposed in the insulating layer 80 at the location corresponding to a source electrode of the thin film transistor 70, and the first electrode 20 is connected to the source electrode of the thin film transistor 70 through the via hole. The present invention does not make a strict distinction between a source electrode and a drain electrode of the thin film transistor 70, and the first electrode 20 may be connected to the source electrode of the thin film transistor 70, and may also be connected to the drain electrode.

As illustrated in FIG. 1, the photoelectric conversion structure 30 may include a photodiode 31 and a second electrode 32, a cathode layer of the photodiode 31 is connected to the first electrode 20, and an anode layer of the photodiode 31 is connected to the second electrode 32. As mentioned above, the photodiode 31 may include an N-type amorphous silicon film layer 31a, an intrinsic amorphous silicon film layer 31b and a P-type amorphous silicon film layer 31c. The cathode layer of the photodiode 31 is just the N-type amorphous silicon film layer 31a, and the anode layer is just the P-type amorphous silicon film layer 31c.

Figure 2:
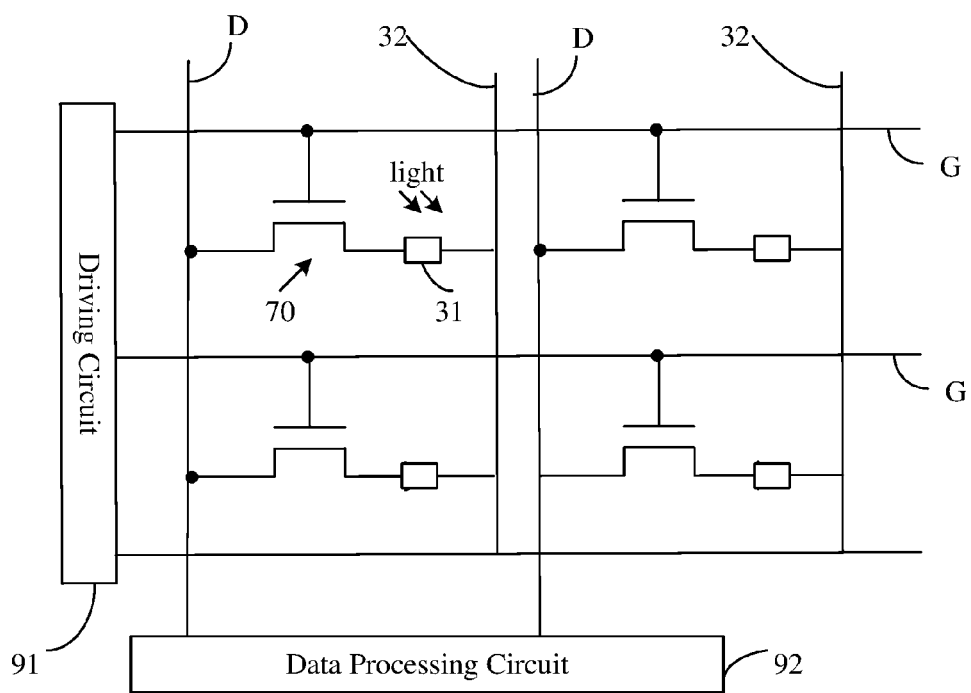
FIG. 2 is a schematic view illustrating an equivalent circuit of an array substrate according to an embodiment of the invention.

That illustrated in FIG. 2 is a schematic view illustrating an equivalent circuit of an array substrate, and on the array substrate, there are provided gate lines G and data lines D, which act to divide the array substrate into a plurality of detection units. When the array substrate works, a reversed voltage is applied to a second electrode 32 so as to turn on the photodiode 31. Once the array substrate is irradiated by visible light, the photodiode 31 acts to carry out photoelectric conversion of a part of the visible light beams, and thus electron-hole pairs are generated. Electrons move toward the first electrode 20 under the action of an electric field. When signals are read, a drive signal is provided by a driving circuit 91 to a detection unit row by row, so as to turn on a thin film transistor 70 within the detection unit row by row. By doing this, the first electrode 20 is conducted to a data processing circuit 92 through a source/drain electrode of the thin film transistor 70, and thus the amount of charge on the first electrode 20 is detected.

According to at least an embodiment of the present invention, there is provided a manufacturing method of an array substrate, comprising:

dividing the array substrate into a plurality of detection units;

forming a pattern that includes a first electrode within each of the detection units;

forming a pattern that includes a conductible, reflective layer on pattern of the first electrode;

forming a photoelectric conversion structure on the pattern including the conductive, reflective layer; wherein, a surface of the reflective layer facing the photoelectric conversion structure is a reflection surface.

The step of forming the pattern that includes the conductible, reflective layer may include forming a conductive film layer on the first electrode. For example, it is possible that a conductive material for producing a reflective layer is deposited on a first electrode firstly, and then subjected to a photolithography patterning process so as to form the pattern including the reflective layer.

As mentioned above, the reflective layer may also be formed into an integral structure together with the first electrode.

For example, material for forming the first electrode includes a conductible metal oxide, and the step of forming the conductible, reflective layer includes:

introducing a reductive gas into a reactive chamber, so that a part of metal elementary substance in the metal oxide precipitate.

For example, the metal oxide is indium tin oxide. When the material for forming the first electrode includes indium tin oxide, the reductive gas may be hydrogen gas. The hydrogen gas and indium tin oxide create a reduction reaction, so that a part of elementary substance tin in the indium tin oxide precipitate, and the elementary substance tin is formed to be the reflective layer on a surface of the first electrode.

Certainly, the first electrode may also be other metal oxide, such as indium zinc oxide (IZO). A reductive gas useful for generation of elementary substance zinc by reduction is introduced, so that elementary substance zinc in the indium zinc oxide precipitates, and the reflective layer is formed.

For example, when hydrogen gas is introduced into a reactive chamber, the process parameters are as follows. The gas flux of the hydrogen gas is in the range of 20 to 500 sccm, the introducing time is in the range of 10 to 200 s, the gas pressure of the reactive chamber is in the range of 100 to 300 mT, and the electrode power of the reactive chamber useful for formation of plasma is in the range of 400 to 800 W.

During the process, precipitation situation of the metal elementary substance may be controlled by means of adjusting various process parameters. For example, by means of adjusting various parameters, after precipitation of the metal elementary substance, the light transmittance of an integral structure formed by a first electrode and the metal elementary substance is 20% to 30% of the light transmittance of the first electrode in the case of no precipitation of metal elementary substance.

For example, the gas flux of the hydrogen gas is 200 sccm, the introducing time is 100 s, the gas pressure of the reactive chamber is 200 mT, and the electrode power of the reactive chamber for formation of plasma is 600 W.

Further, before the step of forming the pattern that includes the first electrode within each of the detection units, it further includes forming a thin film transistor within each of the detection units;

forming an insulating layer on the thin film transistor; and forming a via hole in the insulating layer at the location corresponding to a source electrode of the thin film transistor, so that the first electrode is connected to the source electrode of the thin film transistor.

For example, firstly, a pattern including a gate electrode is formed on a base. Namely, a gate metal layer is formed on the base, and then subjected to a patterning process, so as to form the pattern including the gate electrode. The array substrate may further include a gate line, which may be formed synchronously with the gate electrode.

Next, a pattern including a source electrode and a drain electrode is formed. After formation of the gate electrode, it is possible that a gate insulating layer is deposited firstly, and after that, a source/drain metal layer is formed on the gate insulating layer, and then subjected to a photolithography patterning process, so as to form source and drain electrodes.

Next, an insulating layer is formed, and on the insulating layer at the location corresponding to the source electrode, there is formed a via hole acting to connect the first electrode and the source electrode. Upon formation of the first electrode, a first electrode material layer is deposited firstly. Due to the fact that the via hole is disposed at the location corresponding to the source electrode, the first electrode material layer will be connected to the source electrode through the via hole, and after that, it is subjected to a photolithography patterning process, so as to form a pattern including the first electrode.

As mentioned above, the photoelectric conversion structure may include a second electrode and a photodiode, and the step of forming the photoelectric conversion structure may include: forming a photodiode, so that a cathode layer of the photodiode is connected to the first electrode; for example, it is possible that an N-type amorphous silicon film layer, an intrinsic amorphous silicon film layer and a P-type amorphous silicon film layer are formed in sequence, and then are subjected to a photolithography patterning process, so as to form the photodiode.

A pattern that includes a transparent second electrode is formed on the anode layer of the photodiode.

The forgoing is description of an array substrate and a manufacturing method thereof provided by embodiments of the invention. As can be seen, a reflective layer is provided between a first electrode and a photoelectric conversion structure, and incident light beams passing through the photodiode will go through the photoelectric conversion structure after they are reflected by the reflective layer, so as to enhance the utilization rate of light. Furthermore, a metal elementary substance in the first electrode precipitates to form a reflective layer with the aid of a reductive gas, and therefore, there is no need to introduce other material for producing the reflective layer, and the manufacturing process is simplified. Meanwhile, the reflective layer may also serve to shelter a thin film transistor, without the need of producing an additional light shading layer for protection of the thin film transistor, and the manufacturing cost is reduced.

According to at least an embodiment of the present invention, there is provided an X-ray flat panel detector, which includes the above-mentioned array substrate and an X-ray conversion layer 60 (as illustrated in FIG. 1) disposed on the photoelectric conversion structure of the array substrate.

The X-ray conversion layer 60 is a film layer including a scintillator. The scintillator is capable of converting X-ray photons into visible light beams after it is subjected to X-ray exposure, and it may be cesium iodide.

When X-rays irradiate the X-ray flat panel detector, the X-rays may be converted by the X-ray converting layer into visible light beams, and the visible light beams may be transformed by a photoelectric conversion structure within each detection unit into electric signals. A driving circuit of the array substrate turns on thin film transistors on the array substrate row by row by means of providing a drive signal, so as to detect signals of detection units on the array substrate. Because the utilization rate of light can be enhanced by the array substrate provided by embodiments of the invention, the detection accuracy of the X-ray flat panel detector including the array substrate is also enhanced accordingly.

Figure 3:
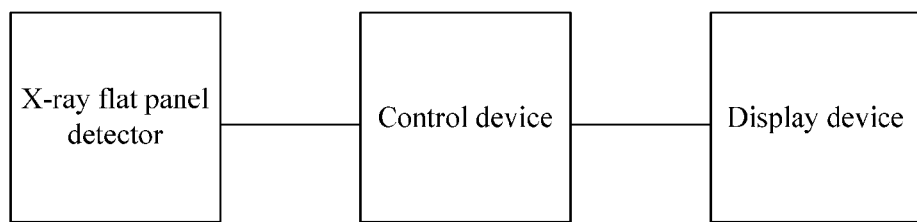
FIG. 3 is a schematic block diagram illustrating an image pickup system according to an embodiment of the invention.

According to at least an embodiment of the present invention, there is provided an image pickup system, which includes the aforesaid X-ray flat panel detector and a display device. For example, the image pickup system further includes a control device, as illustrated in FIG. 3. For example, the image pickup system is applied to medical check, and electric signals detected by the X-ray flat panel detector may be transmitted into a control device (e.g. a computer). The control device is configured to transform the electric signals into image signals, and to make the display device display a corresponding image, and thus distribution of X-rays are seen intuitively. Because the detection accuracy of the X-ray flat panel detector in embodiments of the invention is relatively high, the image displayed in the image pickup system is more clear and accurate.

Descriptions made above are merely exemplary embodiments of the present invention, but are not used to limit the protection scope of the invention. The protection scope of the invention is determined by the attached claims.

This application claims the benefit of priority from Chinese patent application No. 201510095303.0 filed on Mar. 3, 2015, the disclosure of which is incorporated herein in its entirety by reference as a part of the present application.

The invention claimed is:

1. An array substrate, divided into a plurality of detection units, each of the detection units has a first electrode and a photoelectric conversion structure provided therein, wherein, the first electrode is disposed on a side of the photoelectric conversion structure opposite to a light incident side of the photoelectric conversion structure, and is electrically connected to the photoelectric conversion structure, wherein, a reflective layer that is electrically conductive is further included between the first electrode and the photoelectric conversion structure, and a surface of the reflective layer facing the photoelectric conversion structure is a reflection surface.

2. The array substrate according to claim 1, wherein, the reflective layer is a conductive film layer electrically connected to the first electrode.

3. The array substrate according to claim 1, wherein, the reflective layer and the first electrode are formed into an integral structure.

4. The array substrate according to claim 3, wherein, the first electrode has a material including an oxide of a conductive metal, and the reflective layer is formed of an elementary substance of the metal.

5. The array substrate according to claim 4, wherein, the reflective layer is formed of an elementary substrate of the metal that is obtained by carrying out a reduction reaction on a surface of the first electrode facing the photoelectric conversion structure.

6. The array substrate according to claim 5, wherein, the metal oxide is indium tin oxide, and the reflective layer is formed of an elementary substance tin that is obtained by carrying out reduction reaction of the indium tin oxide.

7. The array substrate according to claim 1, wherein, one thin film transistor is further included in each of the detection units, an insulating layer is provided between the thin film transistor and the first electrode, a via hole is disposed in the insulating layer at a location corresponding to a source electrode of the thin film transistor, and the first electrode is connected to the source electrode of the thin film transistor through the via hole.

8. The array substrate according to claim 1, wherein, the photoelectric conversion structure includes a photodiode and a second electrode, a cathode layer of the photodiode is connected to the first electrode, and an anode layer of the photodiode is connected to the second electrode.

9. An X-ray flat panel detector, comprising the array substrate according to claim 1 and an X-ray conversion layer disposed on the photoelectric conversion structure of the array substrate.

10. An image pickup system, comprising the X-ray flat panel detector according to claim 9 and a display device.

11. The image pickup system according to claim 10, further comprising a control device, which is configured to transform an electric signal detected by the X-ray flat panel detector into an image signal, and to control the display device to display an image in correspondence with the image signal.

12. A manufacturing method of an array substrate, comprising:
dividing the array substrate into a plurality of detection units;
forming a pattern including a first electrode within each of the detection units;
forming a pattern of a conductive reflecting layer on the pattern including the first electrode; and
forming a photoelectric conversion structure on the pattern of the conductive reflecting layer,
wherein, a surface of the reflective layer facing the photoelectric conversion structure is a reflection surface.

13. The manufacturing method according to claim 12, wherein, forming the pattern of the conductive reflecting layer includes:
forming a conductive film layer on the first electrode.

14. The manufacturing method according to claim 12, wherein, the reflective layer and the first electrode are formed into an integral structure.

15. The manufacturing method according to claim 14, wherein, the first electrode has a material including a conductive metal oxide, and forming the conductive reflecting layer includes:
introducing a reductive gas into a reactive chamber, so that a part of metal elementary substance in the metal oxide precipitate.

16. The manufacturing method according to claim 15, wherein, the metal oxide is indium tin oxide.

17. The manufacturing method according to claim 16, wherein, the reductive gas is hydrogen gas.

18. The manufacturing method according to claim 17, wherein, a gas flux of the hydrogen gas is in a range of 20 to 500 sccm, an introducing time is in a range of 10 to 200 s, and a gas pressure of the reactive chamber is in a range of 100 to 300 mT, and an electrode power of the reactive chamber used for formation of plasma is in a range of 400 to 800 W.

19. The manufacturing method according to claim 12, wherein, before forming the pattern including the first electrode within each of the detection units, it further includes forming a thin film transistor within each of the detection units;
forming an insulating layer on the thin film transistor; and
forming a via hole in the insulating layer at a location corresponding to a source electrode of the thin film transistor, so that the first electrode is connected to the source electrode of the thin film transistor.

20. The manufacturing method according to claim 12, wherein, forming the photoelectric conversion structure includes:
forming a photodiode, a cathode layer of which is connected to the first electrode; and
forming a pattern including a transparent second electrode on an anode layer of the photodiode.

* * * * *